(12) United States Patent
Fraas et al.

(10) Patent No.: US 6,303,853 B1
(45) Date of Patent: Oct. 16, 2001

(54) SHINGLE CIRCUITS FOR THERMOPHOTOVOLTAIC SYSTEMS

(75) Inventors: Lewis M. Fraas, Issaquah; Wilbert E. Daniels, Puyallup; James E. Avery, Fall City; John E. Samaras; Jason B. Keyes, both of Seattle, all of WA (US)

(73) Assignee: JX Crystals Inc., Issaquah, WA (US)

( * ) Notice: Subject to any disclaimer, the term of this patent is extended or adjusted under 35 U.S.C. 154(b) by 0 days.

(21) Appl. No.: 09/506,278

(22) Filed: Feb. 17, 2000

Related U.S. Application Data

(63) Continuation-in-part of application No. 09/369,263, filed on Aug. 6, 1999, now Pat. No. 6,232,545
(60) Provisional application No. 60/095,443, filed on Aug. 6, 1998.

(51) Int. Cl.[7] .................................................. H01L 31/00
(52) U.S. Cl. .............................................................. 136/253
(58) Field of Search ............................................. 136/253

(56) References Cited

U.S. PATENT DOCUMENTS

| | | |
|---|---|---|
| 3,433,676 | 3/1969 | Stein . |
| 3,751,303 | 8/1973 | Kittl . |
| 3,929,510 | 12/1975 | Kittl . |
| 4,045,246 | 8/1977 | Mlavsky et al. . |
| 4,180,414 | 12/1979 | Diamond et al. . |
| 4,234,352 | 11/1980 | Swanson . |
| 4,746,370 | 5/1988 | Woolf . |
| 4,776,895 | 10/1988 | Goldstein . |
| 4,976,606 | 12/1990 | Nelson . |
| 5,080,724 | 1/1992 | Chubb . |
| 5,091,018 | 2/1992 | Fraas et al. . |
| 5,096,505 | 3/1992 | Fraas et al. . |
| 5,118,361 | 6/1992 | Fraas et al. . |
| 5,123,968 | 6/1992 | Fraas et al. . |
| 5,217,539 | 6/1993 | Fraas et al. . |
| 5,248,346 | 9/1993 | Fraas et al. . |
| 5,255,666 | 10/1993 | Churchod . |
| 5,312,521 | 5/1994 | Fraas et al. . |
| 5,383,976 | 1/1995 | Fraas et al. . |
| 5,389,158 | 2/1995 | Fraas et al. . |
| 5,401,329 | 3/1995 | Fraas et al. . |
| 5,403,405 | 4/1995 | Fraas et al. . |
| 5,505,789 | 4/1996 | Fraas et al. . |
| 5,512,109 | 4/1996 | Fraas et al. . |
| 5,551,992 | 9/1996 | Fraas . |
| 5,560,783 | 10/1996 | Hamlen . |
| 5,616,186 | 4/1997 | Fraas et al. . |
| 5,651,838 | 7/1997 | Fraas et al. . |
| 5,865,906 | 2/1999 | Ferguson et al. . |

FOREIGN PATENT DOCUMENTS 63-316486  12/1988  (JP) .

OTHER PUBLICATIONS

Fraas, Lewis et al., "Status of TPV Commercial System Development Using GaSb Infrared Sensitive Cells," Paper presented at Second World Photovoltaic Specialists Conference, Vienna, Austria, Jul. 6–10, 1998.

(List continued on next page.)

*Primary Examiner*—Mark Chapman
(74) *Attorney, Agent, or Firm*—James Creighton Wray; Meera P. Narasimhan

(57) ABSTRACT

A shingle circuit array and a method of assembling the shingle circuit is provided. The array has a shingle circuit with a substrate, an insulation film layer, a metal layer and TPV cells connected to the metal layer in series forming a shingle pattern with terraces. The substrate is of CTE matched material. The metal layer may be copper pads deposited on the terraces. The TPV cells are bonded to the copper pads and may be GaSb cells. Substrate materials include AlSiC or a Cu/Invar/Cu laminate sheet. The AlSiC material may be a microstructure having a continuous Al-metal phase with a discrete SiC particulate phase. The substrate may also be an enameled cast-iron substrate. The shingle circuit array may be provided in a TPV generator.

25 Claims, 3 Drawing Sheets

OTHER PUBLICATIONS

JX Crystals Inc., Sales brochure for the Midnight Sun® Stove, "Congenerates 100 watts of electricity," Issaquah, WA.

Morgan, M.D. et al., "Radioisotope Thermal Photovoltaic Application of the GaSB Solar Cell, " NASA SPRAT Conference, pp. 349–358, (U.S.A. 1989).

E. Kittl and G. Guazzoni, "Design Analysis of TPV–Generator System," Proceedings of the 25th Annual Power Sources Conference, May 1972, pp. 106–110.

A.C. Day, W.E. Horne and M.D. Morgan, "Application of the GaSb Solar Cell in Isotope–Heated Power Systems," Conference Record of the 21st IEEE Photovoltaic Specialists Conference, Kissimmee, FL., May 1990, pp. 1320–1325.

JX Crystals Inc., Babcock & Wilcox, informational brochure, "High Performance 500 Watt Portable Themophtovoltaic Power Supply Using Diesel Fuel Being Developed by Babcock & Wilcox and JX Crystals," rev. Mar. 20, 1997.

Whitaker, T., "GaSb Shines Brighter Than The Midnight Sun," Compound Semiconductor, Fall I, 1998, pp. 33–34.

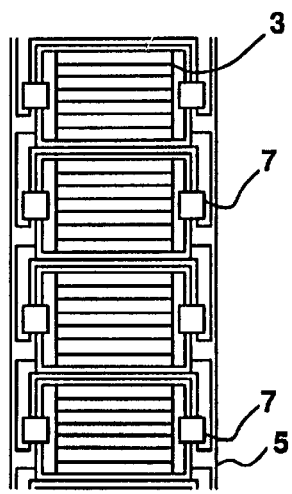
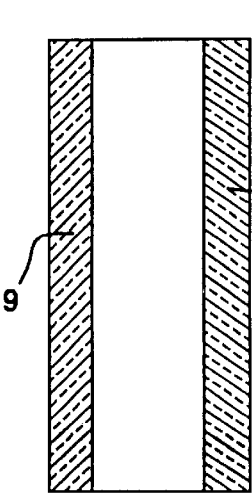
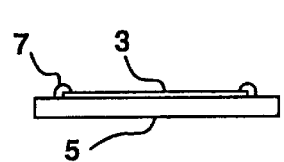
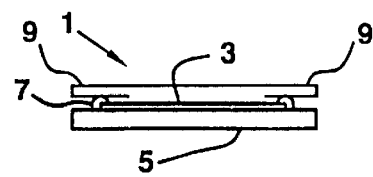
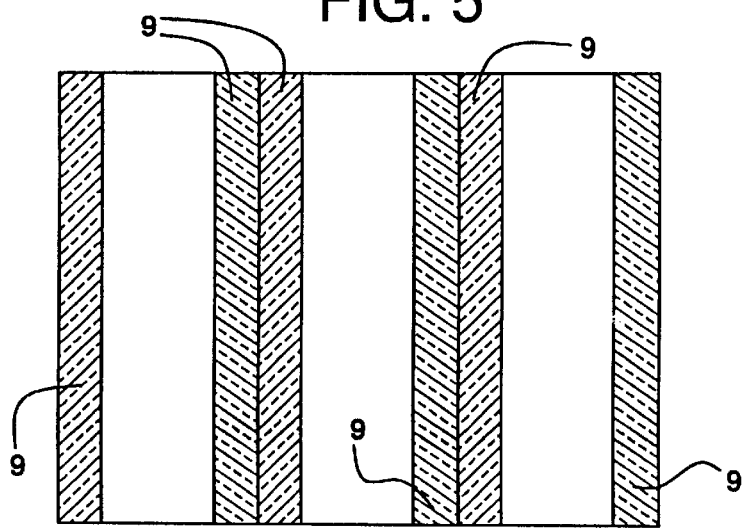
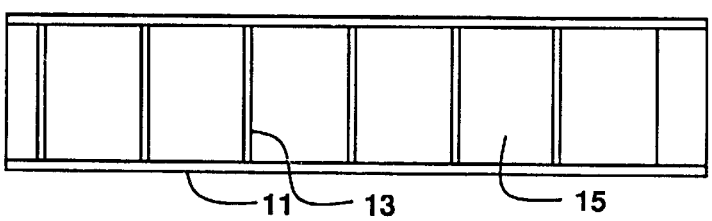
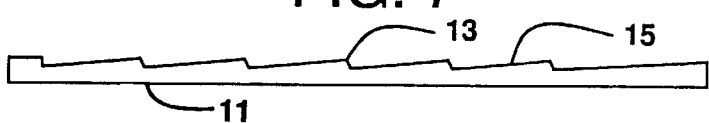
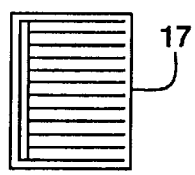

SHINGLE CIRCUITS FOR THERMOPHOTOVOLTAIC SYSTEMS

This application is a continuation-in part of Ser. No. 09/369,263 filed Aug. 6, 1999 U.S. Pat. No. 6,232,545 which claims benefit provisional 60/095,443 filed Aug. 6, 1998.

BACKGROUND OF THE INVENTION

In prior thermophotovoltaic (TPV) circuit designs, GaSb TPV cells are soldered down onto metal pads on a copper substrate where a thin insulating layer isolates the metal pads from the copper substrate. Flexible interconnects are then bonded from pads on the top of the cell over to pads on the circuit. Finally, mirrors are attached over the lead bond areas. Since the leads have to carry large currents in TPV circuits, the lead area is fairly large. Consequently, the mirrors typically cover 40% of the circuit area.

There are two disadvantages to this configuration. First, although the lead attach step can be automated, it is still quite time consuming. Eliminating the lead bonding step is desirable. Second, the mirror area leads to a loss in system efficiency. This system efficiency loss comes about as follows. If radiation heat transfer were the only heat transfer mechanism, then the mirror area would not have a negative impact because the radiation hitting the mirrors is simply returned to the infrared (IR) emitter in a TPV system. However, heat transfer also occurs by conduction and convection through the air space between the IR emitter and the cell circuit. Recent measurements indicate that this heat transfer process is as much as 30% of the total heat transfer rate. The mirror area is additional area that does not contribute to electric power production but does receive heat through the air heat transfer mechanisms. It is therefore desirable to reduce the mirror area and to increase the fractional active cell area.

An alternative circuit concept for solar photovoltaic application is to shingle the cells, with the top of one cell attached to the underside of the next cell. Unfortunately, this idea has been tried without success. The problem is that during thermal cycling, the substrate material expands at a different rate than the cell so that the rigid bond joint eventually is pulled apart forming an open circuit. A need exists for flexible leads that avoid this failure mechanism.

SUMMARY OF THE INVENTION

The solar photovoltaic shingle concept did not work because the silicon solar cells are quite large and silicon has a very low thermal expansion coefficient ($4.2 \times 10^{-6}/°$ C.) compared to substrate materials. Furthermore, the temperature excursions for space solar panels are very large. However, GaSb TPV cells are smaller and have a higher thermal expansion coefficient of $7 \times 10^{-6}/°$ C. Also, there have been recent developments in the field of GaAs microwave device packaging. The thermal expansion coefficient for GaAs is $6.5 \times 10^{-6}/°$ C.

Packaging materials now available for GaAs devices are AlSiC composites and metal laminates. AlSiC composites consist of SiC particles in an aluminum matrix. This material may be cast in various shapes and has a thermal expansion coefficient of $7.5 \times 10^{-6}/°$ C. An example of a metal laminate is Cu/Invar/Cu.

One preferred embodiment of a TPV shingle circuit utilizes a terraced AlSiC substrate. An insulating film is deposited over the terraces and then copper pads are deposited on the terrace top faces. GaSb TPV cells are then bonded to the copper pads and connected in series in a shingle pattern.

There are alternate means of creating shingled circuits. For example, a Cu/Invar/Cu laminate sheet may be used. The terraces may then be formed with a thermally conductive epoxy, and then the cell shingle pattern may be fabricated. In a second alternate, an iron/nickel alloy with 46% nickel (alloy 46) may be used as the shingle circuit substrate. This material has a CTE of $7.3 \times 10^{6}/°$ C. which is similar to that of AlSiC. The terraces may be machined, cast or forged into the substrate surface. An insulator layer is then deposited, followed by the deposition of the metal pads and then the placement of the shingled cells.

The AlSiC material may also be used as a substrate for a GaAs/GaSb mechanically stacked concentrator solar cell circuit. In this case, four contacts are required to the front and back of the top cell and to the front and back of the bottom cell. In prior art designs, the back of the bottom cell is soldered down to a circuit and three flexible leads run from pads on the circuit to the front of the bottom cell and to the back and front of the top cell. The two cell front leads can be done normally as for a single chip. However, the lead to the back of the top cell requires special handling. Using an AlSiC circuit with a ridge, the backs of both cells may be soldered in one operation and the fronts of both cells may be bonded in a second operation, just as if the stack were a single chip.

The AlSiC microstructure is composed of a continuous Al-metal phase with discrete SiC particulate phase. The AlSiC composite microstructure is fully dense with no void space creating a hermetic material. The leak rates are better than $10^{-9}$ atm cc/s measured on 0.010-inch material cross sections. This hermeticity level allows fabricated AlSiC packages to provide environmental protection of functional components.

The unique AlSiC material properties result from a combination of the constituent material properties. AlSiC properties are tailored by varying the ratio of these constituents. The integrated circuit (IC) coefficient of thermal expansion (CTE) compatible AlSiC compositions have an SiC particulate content between 50–68 vol %.

AlSiC composite materials have thermal conductivity values that are similar to aluminum metal, and CTE values that are similar to alumina. These attributes make AlSiC packages ideal for direct active device attachment to maximize thermal dissipation and improve product reliability.

AlSiC strength and stiffness compare favorably to traditional packaging materials. The ultimate bending strength of AlSiC is two to three times greater than Al-metal.

The active cell area/total area ratio, or packing factor, is quite high for this configuration since no space is taken up by interconnects and traces.

Bi—Sn solder was selected since it has a thermal coefficient of expansion (TCE) of 15 rather than 27 for Sn62, and so is closer to the GaSb TCE of about 7.

The current is usually directed through the back metal and directly into a thick copper circuit trace. There is only about 1 micron thickness of backside metal on the cells for this reason. The fill factor for this configuration may be improved with thicker backside metal.

However, AlSiC composites are currently expensive. Thus, in another preferred embodiment the present inventors provide alternative less expensive substrate materials for the GaSb TPV shingle circuits, such as, but not limited to, cast-iron with enamel.

Enameled cast-iron circuits are an attractive low cost candidate for the terraced substrates for the TPV shingled circuits. Low cost enameled cast-iron is used in bathtubs, sinks, pots, pans and recently in cars.

The search for alternative lower-cost substrates is based on an algorithm created by the present inventors. The algorithm calculates the movement of the solder bump connecting between the cells as a result of a given CTE mismatch, a given cell size and a given temperature excursion. The application of this algorithm is shown in Table 1.

The calculated solder bump movement for the GaSb TPV cell on cast iron of 1.5 microns is small enough to be acceptable. The inventors fabricated TPV shingle circuits on various substrate materials and thermally cycled them and looked for performance degradation. The results are shown in Table 2.

As shown in Table 3, none of the TPV shingle circuits shown in Table 2 show any degradation after 100 cycles.

These and further and other objects and features of the invention are apparent in the disclosure, which includes the above and ongoing written specification, with the claims and the drawings.

BRIEF DESCRIPTION OF THE DRAWINGS

FIG. 1 is a top view of the current TPV circuit design.

FIG. 2 is a top view of a TPV circuit with mirrors and filters attached.

FIG. 3 is an end view of the current TPV circuit design.

FIG. 4 is an end view of the current TPV circuit design with edge mirrors attached over the lead bond area.

FIG. 5 is a top view of a current TPV array with edge mirrors.

FIG. 6 is a top view of a terrace substrate.

FIG. 7 is a side view of a terrace substrate.

FIGS. 8 and 14 are top views of a cell.

DETAILED DESCRIPTION OF THE PREFERRED EMBODIMENTS

Figure 9:
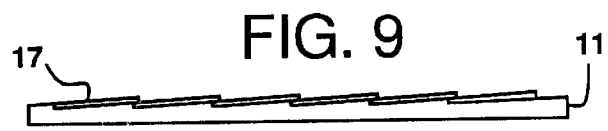
FIGS. 9 and 17 are side views of a shingle circuit.

FIGS. 1–5 show a prior TPV circuit 1 design. In this design, GaSb TPV cells 3 are soldered down onto metal pads on a copper substrate 5 where a thin insulating layer isolates the metal pads from the copper substrate. Flexible interconnects 7 are than bonded from pads on the top of the cell 3 over to pads on the substrate 5. Finally, mirrors 9 are attached over the lead bond areas. Since the leads 7 have to carry large currents in TPV circuits, the lead area is fairly large. Consequently, the mirrors 9 typically cover 40% of the circuit area.

The FIG. 1 configuration has two disadvantages First, although the step of attaching the lead may be automated, it is still quite time consuming. Eliminating this step is desirable. Second, the mirror area leads to a loss in system efficiency. This system efficiency loss comes about as follows. If radiation heat transfer were the only heat transfer mechanism, then mirror area would not have a negative impact because the radiation hitting the mirrors is simply returned to the IR emitter in a TPV system. However, heat transfer also occurs by conduction and convection through the air space between the IR emitter and the cell circuit. Recent measurements at JX Crystals now indicate that this heat transfer process can be as much as 30% of the total heat transfer rate. The mirror area is additional area that does not contribute to electric power production but does receive heat through the air heat transfer mechanisms. It is therefore desirable to reduce the mirror area and to increase the fractional active cell area.

The solar photovoltaic shingle concept did not work because the silicon solar cells are quite large and silicon has a very low thermal expansion coefficient ($4.2 \times 10^{-6}/°$ C.) compared to substrate materials. Furthermore, the temperature excursions for space solar panels are very large. However, GaSb TPV cells are smaller and have a higher thermal expansion coefficient of $7 \times 10^{-6}/°$ C. Also, there have been recent developments in the field of GaAs microwave device packaging. The thermal expansion coefficient for GaAs is $6.5 \times 10^{-6}/°$ C.

Packaging materials now available for GaAs devices are AlSiC composites and metal laminates. AlSiC composites consist of Sic particles in an aluminum matrix. This material can be cast in various shapes and has a thermal expansion coefficient of $7.5 \times 10^{-6}/°$ C. An example of a metal laminate is Cu/Invar/Cu.

Figure 10:
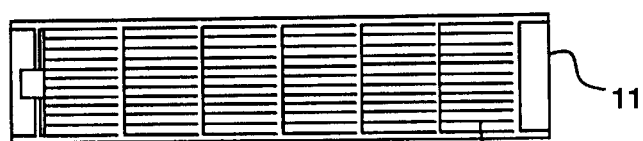
FIGS. 10 and 16 are top views of a shingle circuit.
Figure 11:
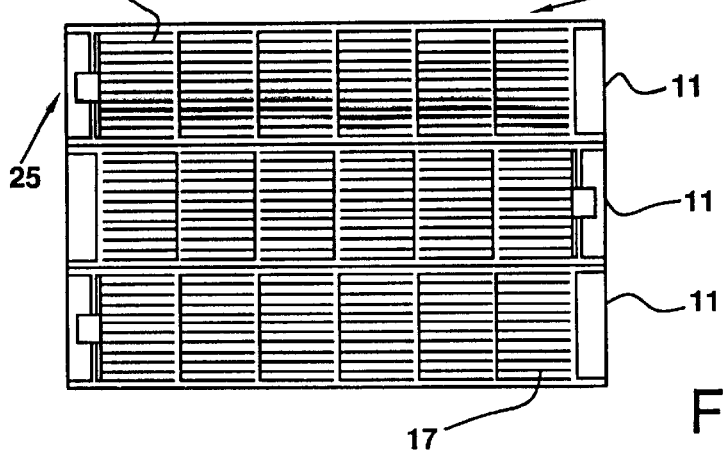
FIG. 11 is a top view of a shingle array.
Figure 16:
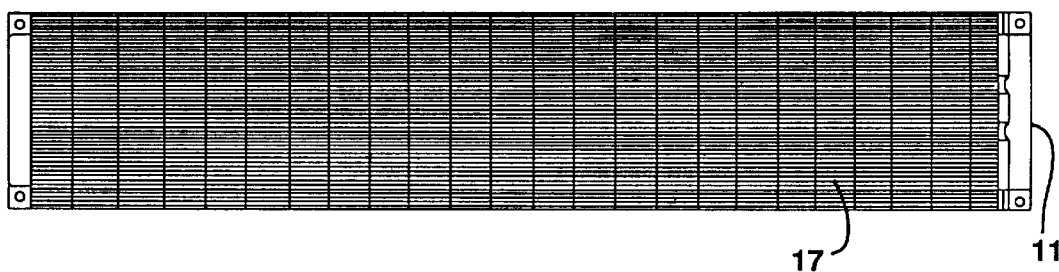
Figure 17:
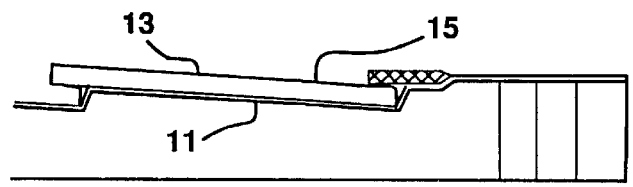
Figure 18:
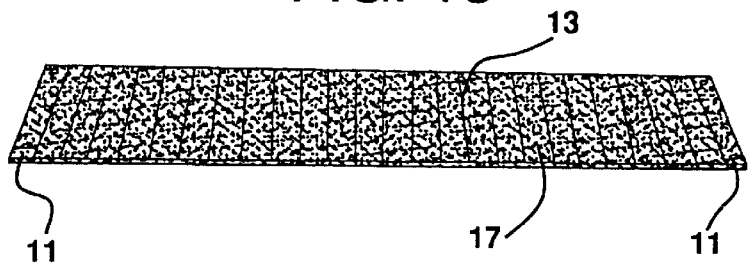
FIG. 18 is a top view of a shingle array with 72-cell circuit.

FIGS. 6–18 show a preferred embodiment of the TPV shingle circuit. This concept utilizes a terraced metal substrate 11, which is preferably of AlSiC or enameled cast-iron material. An insulating film is deposited over the terraces 13 and then copper pads are deposited on the terrace top faces 15. GaSb TPV cells 17 are then bonded to the copper pads and connected in series in a shingle pattern, FIGS. 10 and 16 are top views of a single shingle circuit 25. FIGS. 11 and 18 show top views of a shingle circuit array 27.

There are alternate preferred means of creating shingled circuits 25. For example, a Cu/Invar/Cu laminate sheet may be used. The terraces may then be formed with a thermally conductive epoxy or ceramic, and then the cell shingle pattern may be fabricated. Alternatively, an iron/nickel alloy with 46% nickel (alloy 46) may be used as the shingle circuit substrate. The terraces may be machined, cast or Forged into the substrate surface. An insulator layer is than deposited, followed by the deposition of the metal pads and then the placement of the shingled cells. In fact, any material may be used as the shingle circuit substrate provided that it has an acceptable CTE and thermal conductivity.

The AlSiC material may also be used as a substrate 11 for a GaAs/GaSb mechanically stacked concentrator solar cell circuit. In this case, four contacts are required to the front and back of the top cell and to the front and back of the bottom cell. In prior art designs, the back of the bottom cell is soldered down to a circuit and three flexible leads run from pads on the circuit to the front of the bottom call and to the back and front of the top cell. The two cell front leads may be done normally as for a single chip. However, the lead to the back of the top cell requires special handling. Using an AlSiC circuit with a ridge, the backs of both cells can be soldered in one operation and the fronts of both cells can be bonded in a second operation just as if the stack were a single chip.

Figure 12:
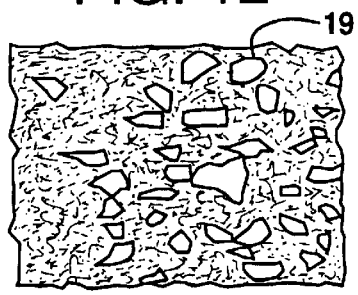
FIG. 12 is a top view of the microstructure of AlSiC.
Figure 13:
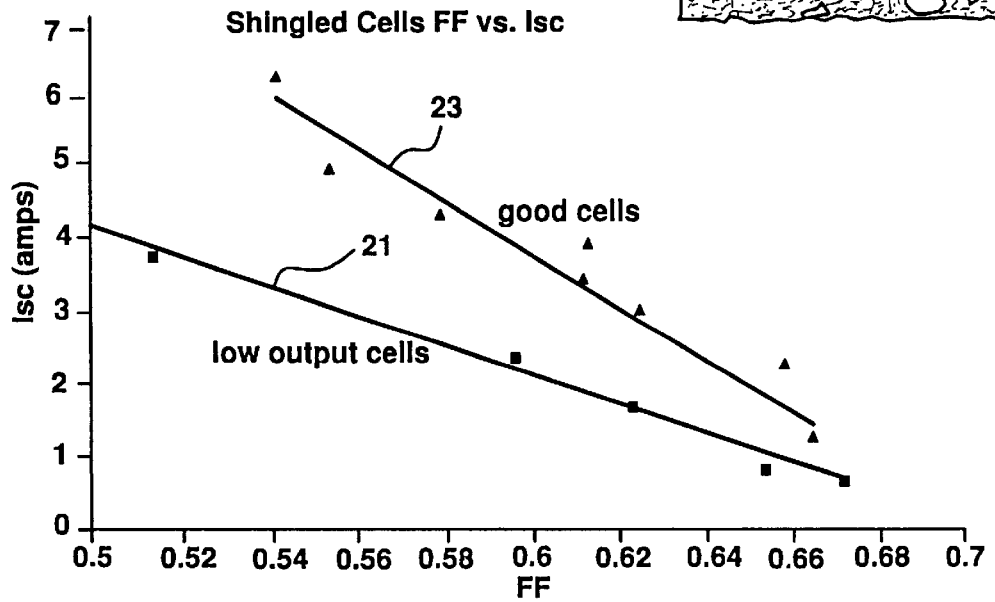
FIG. 13 is a graph of the fill factor versus Isc for a shingled cell circuit.
Figure 14:
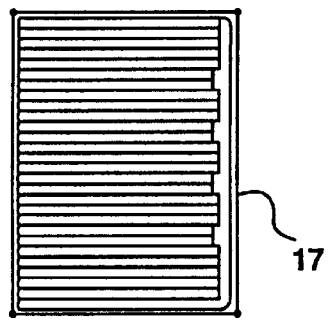
Figure 15:
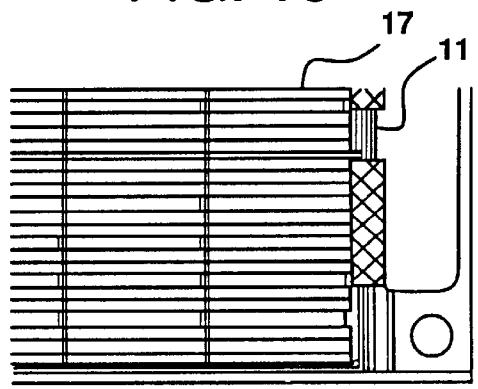
FIG. 15 is an enlarged close-up of the shingle circuit.

The AlSiC microstructure is composed of a continuous Al-metal phase with discrete SiC particulate 19 phase, as shown in FIG. 12. The AlSiC composite microstructure is fully dense with no void space creating a hermetic material. He leak rates are better than $10^{31\ 9}$ atm cc/s measured on 0.010-inch material cross sections. This hermeticity level allows fabricated AlSiC packages to provide environmental protection of functional components.

The unique AlSiC material properties result from a combination of the constituent material properties. AlSiC properties are tailored by varying the ratio of these constituents. The integrated circuit (IC) coefficient of thermal expansion (CTE) compatible AlSiC have a SiC particulate content between 50–68 vol %. Table 1 compares the material properties of AlSiC to Si, GaAs, and traditional packaging materials.

AlSiC composite materials have thermal conductivity values that are similar to aluminum metal, and CTE values that are similar to alumina. These attributes make AlSiC packages ideal for direct active device attachment to maximize thermal dissipation and improve product reliability.

AlSiC strength and stiffness compare favorably to traditional packaging materials. The ultimate bending strength of AlSiC is two to three times greater than Al-metal. The AlSiC Young's modulus (a measure of a material's stiffness) is three times greater than Al-metal.

A simple, low cost assembly process for interconnecting TPV cells into circuits is by simply stacking them together like shingles. This idea did not work out for solar cells because of the thermal cycle problems in the finished package. However, that problem is overcome by a new packaging concept where the thermal coefficient of expansion is tailored as required.

Test samples were assembled quickly, as there was no need for lead frames or lead forming, no special bonding jigs to precisely locate tab fingers, no exacting placements, no point by point lead bonding. A couple of dots of solder paste are dispensed on each front ohmic bar, the dies are picked and placed against a fence and then the assembly is tossed into the reflow oven for five minutes. This is easily an order of magnitude faster than current packaging methods. Also, the active cell area/total area ratio, or packing factor, is quite high for this configuration since no space is taken up by interconnects and traces.

Bi—Sn solder was selected since it has a thermal coefficient of expansion (TCE) of 15 rather than 27 for Sn62, and so is closer to the GaSb TCE of about 7.

After reflow, the samples are durable enough to be handled, moved by hand on and off a hot plate, carried around, flash tested, and dangled by their pigtails.

A seven cell sample was first made with scrap cells. A second seven cell sample was then made with better cells. Two 30 gauge pigtails were added to each end and the units were 4-point flash tested at a variety of light levels. The fill factor versus Isc data is graphed in FIG. 13 for the first 21 and second 23 samples. The fill factor falls off fairly rapidly with increasing light level. Using conventional assembly techniques, at least a mid 60's fill factor up to several amps is obtained. The back metal is not thick enough to support high lateral current flows. The current is directed straight through the back metal and directly into a thick copper circuit trace. There is only about 1 micron thickness of backside metal on the cells for that reason. The fill factor for this configuration may be improved with thicker backside metal.

For example, one to any number of the cell circuits may be used in combination, such as but not limited to, two 72 cell circuits that may be used in a TPV stove or eight circuits that may be incorporated in a 1 kW TPV cylinder array (FIG. 18).

In another preferred embodiment the present inventors provide alternative less expensive substrate materials for the GaSb TPV shingle circuits, such as, but not limited to, cast-iron with enamel.

Enameled cast-iron circuits are an attractive low cost candidate for the terraced substrates for the TPV shingled circuits. Low cost enameled cast-iron is used in bathtubs, sinks, pots, pans and recently in cars.

The search for alternative lower-cost substrates is based on an algorithm created by the present inventors. The algorithm calculates the movement of the solder bump connecting between the cells as a result of a given CTE mismatch, a given cell size and a given temperature excursion. The application of this algorithm is shown in Table 1.

Table 1 shows that the distortion associated with thermal mismatch for silicon space cells is clearly unacceptable. It also shows that the distortion associated with thermal mismatch for the GaSb/AlSiC should be acceptable.

The calculated solder bump movement for the GaSb TPV cell on cast iron of 1.5 microns is small enough to be acceptable. The inventors fabricated TPV shingle circuits on various substrate materials and thermally cycled them and looked for performance degradation. The results are shown in Table 2.

Table 2 shows that the alloy substrates have a CTE similar to that of AlSiC or GaSb ($7 \times 10_{-6}/°$ C.). The carbon steel substrates have a CTE similar to that of cast iron $10 \times 10_{-6}/°$ C.), while the titanium substrates have an intermediate CTE ($9 \times 10_{-6}/°$ C.).

As shown in Table 3, none of the TPV shingle circuits shown in Table 2 show any degradation after 100 cycles.

While the invention has been described with reference to specific embodiments, modifications and variations of the invention may be constructed without departing from the scope of the invention.

TABLE 1

Solder bump movement for various hypothetical shingle circuits

| Material Pair | ΔCTE ($\times 10^{-6}/°$ C.) | ΔT (° C.) | Cell Size (cm) | Distortion (microns) |
|---|---|---|---|---|
| Si/Cu | 10 | 100 | 10 | 100 |
| GaSb/AlSiC | 0.5 | 50 | 1 | 0.25 |
| GaSb/(cast iron) | 3 | 50 | 1 | 1.5 |

TABLE 2

Performance of 6 Circuits for Tecogen Cylinder
Test temp. = 20° C.

| Date | ID | ID** | FF | Voc | Isc | Imax | Vmax | Pmax | Light |
|---|---|---|---|---|---|---|---|---|---|
| 1/20/00 | dvlp c0 | A-1 | 0.693 | 2.39 | 2.94 | 2.59 | 1.88 | 4.88 | 1.279 |
| 1/20/00 | dvlp c0 | A-2 | 0.701 | 2.4 | 2.93 | 2.48 | 1.98 | 4.91 | 1.274 |

TABLE 2-continued

Performance of 6 Circuits for Tecogen Cylinder
Test temp. = 20° C.

| Date | ID | ID** | FF | Voc | Isc | Imax | Vmax | Pmax | Light |
|---|---|---|---|---|---|---|---|---|---|
| 1/20/00 | dvlp c0 | T-3 | 0.709 | 2.41 | 3 | 2.7 | 1.9 | 5.14 | 1.292 |
| 1/20/00 | dvlp c0 | T-5 | 0.692 | 2.39 | 2.9 | 2.56 | 1.87 | 4.8 | 1.277 |
| 1/20/00 | dvlp c0 | S-1 | 0.701 | 2.39 | 2.91 | 2.59 | 1.88 | 4.87 | 1.271 |
| 1/20100 | dvlp c0 | S-2 | 0.7 | 2.39 | 2.92 | 2.49 | 1.96 | 4.88 | 1.278 |

**Substrate material:
A — alloy 46
T — titanium
S — steel

TABLE 3

Result of Test of the Curcuits after 100 thermocycles*

Test temp. = 20° C.

| Date | ID | ID** | FF | Voc | Isc | Imax | Vmax | Pmax | Light |
|---|---|---|---|---|---|---|---|---|---|
| 1/26100 | dvlp c100 | A-1 | 0.697 | 2.42 | 3.07 | 2.73 | 1.9 | 5.19 | 1.29 |
| 1/26/00 | dvlp c100 | A-2 | 0.705 | 2.42 | 3.05 | 2.7 | 1.93 | 5.21 | 1.299 |
| 1/26/00 | dvlp c100 | T-3 | 0.71 | 2.43 | 3.04 | 2.64 | 1.99 | 5.25 | 1.287 |
| 1/26/00 | dvlp c100 | T-5 | 0.693 | 2.41 | 2.94 | 2.61 | 1.88 | 4.91 | 1.298 |
| 1/26/00 | dvlp c100 | S-1 | 0.705 | 2.42 | 3.02 | 2.72 | 1.9 | 5.16 | 1.303 |
| 1/26/00 | dvlp c100 | S-2 | 0.707 | 2.41 | 2.96 | 2.65 | 1.9 | 5.04 | 1.298 |

*Thermocycle includes:
Heating in an oven from 21° C. to 85° C. (3–3.5 min)
Cooling on a cooling plate with water from 85° C. to 21° C. (about 2 min)
**Substrate material:
A — alloy 46
T — titanium
S — steel

We claim:

1. A cell circuitry apparatus for generators comprising a shingle circuit array with at least one shingle circuit comprising a metal substrate, an insulation layer on the substrate, a metal layer on the substrates and thermophotovoltaic cells connected to the metal layer in series forming a shingle pattern.

2. The apparatus of claim 1, wherein the metal substrate is an enameled cast-iron substrate.

3. The apparatus of claim 2, wherein the shingle circuit array comprises a stacked concentrator solar cell circuit.

4. The apparatus of claim 3, further comprising GaAs/GaSb cell forming the circuit.

5. The apparatus of claim 3, further comprising plural contacts between fronts and backs of top cells of the circuit and between fronts and backs of bottom cells of the circuit.

6. The apparatus of claim 3, further comprising a ridge on the circuit, solders connecting backs of adjacent cells and bonds connecting fronts of adjacent cells forming a single chip stack.

7. The apparatus of claim 6, wherein the solder is Bi—Sn solder.

8. The apparatus of claim 7, wherein the Bi—Sn solder has a thermal coefficient of expansion of 15.

9. The apparatus of claim 1, wherein the substrate has terraces.

10. The apparatus of claim 9, wherein the metal layer is copper pads deposited on the terraces.

11. The apparatus of claim 10, wherein the thermophotovoltaic cells are bonded to the copper pads.

12. The apparatus of claim 1, wherein the insulation layer is an insulating film.

13. The apparatus of claim 1, wherein the thermophotovoltaic cells are GaSb cells.

14. The apparatus of claim 13, further comprising terraces on the substrate, and a thermally conductive epoxy or ceramic forming the terraces and the shingle pattern.

15. The apparatus of claim 1, wherein the substrate has a coefficient of thermal expansion (CTE) matched to said thermophotovoltaic cells.

16. The apparatus of claim 1, further comprising a generator having the shingle circuit array.

17. A method of assembling cell circuitry apparatus comprising forming a shingle circuit having a metal substrate, insulating the substrate with an insulation layer, providing metal contacts on the substrate, connecting thermophotovoltaic cells to the metal contacts, and forming shingles by stacking the thermophotovoltaic cells.

18. The method of claim 17, wherein the forming the shingles comprises forming the substrate as terraces.

19. The method of claim 18, wherein the providing the metal contacts comprises depositing copper pads on the terraces.

20. The method of claim 19, wherein the connecting the thermophotovoltaic cells comprises bonding the cells to the copper pads.

21. The method of claim 18, further comprising forming the terraces by a thermally conductive epoxy or ceramic.

22. The method of claim 17, wherein the forming the substrate comprises providing a substrate of enameled cast-iron material.

23. The method of claim 17, wherein the insulating comprises insulating with an insulation film.

24. The method of claim 17, further comprising forming a shingle circuit array by stacking plural shingle circuits, soldering backs of adjacent cells and bonding fronts of adjacent cells thereby forming a single chip stack.

25. The method of claim 17, further comprising providing the shingle circuit in a generator.

* * * * *